(12) United States Patent
Pinto et al.

(10) Patent No.: US 6,284,615 B1
(45) Date of Patent: Sep. 4, 2001

(54) METHOD AND APPARATUS FOR THE SELECTIVE DOPING OF SEMICONDUCTOR MATERIAL BY ION IMPLANTATION

(75) Inventors: Angelo Pinto, Agusta; Sergio Palara, Aci Sant' Antonio, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/333,691

(22) Filed: Jun. 16, 1999

(30) Foreign Application Priority Data

Jun. 16, 1998 (IT) .............................. MI98A01376

(51) Int. Cl.$^7$ ................................. H01L 21/265
(52) U.S. Cl. ..................... 438/336; 438/340; 438/525; 438/558
(58) Field of Search ..................... 438/326, 309, 438/316, 318, 327, 335, 336, 340, 341, 350, 368, 369, 310, 514, 524, 525, 558, 559, 562, 563, 564

(56) References Cited

U.S. PATENT DOCUMENTS

| | | | |
|---|---|---|---|
| 4,280,854 | * | 7/1981 | Shibata et al. ..................... 438/525 |
| 4,624,046 | * | 11/1986 | Shideler et al. ..................... 438/336 |
| 4,717,678 | * | 1/1988 | Goth ..................... 438/336 |
| 5,183,768 | * | 2/1993 | Kameyama et al. ..................... 438/325 |
| 5,213,989 | * | 5/1993 | Fitch et al. ..................... 438/564 |
| 5,355,006 | * | 10/1994 | Iguchi ..................... 297/296 |
| 5,444,007 | * | 8/1995 | Tsuchiaki ..................... 438/525 |
| 5,480,816 | * | 1/1996 | Uga et al. ..................... 438/563 |
| 5,512,498 | * | 4/1996 | Okamoto ..................... 438/525 |
| 5,593,905 | * | 1/1997 | Johnson et al. ..................... 438/558 |
| 5,719,082 | * | 2/1998 | Violette ..................... 438/309 |
| 5,739,058 | * | 4/1998 | Karniewicz et al. ..................... 438/217 |
| 5,776,814 | * | 7/1998 | Beason ..................... 438/564 |
| 5,804,486 | * | 9/1998 | Zambrano et al. ..................... 438/309 |
| 5,899,723 | * | 5/1999 | Chen et al. ..................... 438/309 |
| 5,940,711 | * | 8/1999 | Zambrano ..................... 438/360 |
| 5,976,960 | * | 11/1999 | Cheffings ..................... 438/525 |
| 6,040,208 | * | 3/2000 | Honeycutt et al. ..................... 438/525 |
| 6,043,130 | * | 3/2000 | Gregory ..................... 438/350 |

* cited by examiner

*Primary Examiner*—Savitri Mulpuri
(74) *Attorney, Agent, or Firm*—Theodore E. Galanthay; E. Russell Tarleton; Seed IP Law Group PLLC

(57) ABSTRACT

The method comprises forming an implantation screening layer of predetermined thickness on the wafer, forming, in the screening layer, a first rectilinear, elongate opening having a first width, and at least a second rectilinear, elongate opening substantially parallel to the first opening and having a second width smaller than the first width is formed on the screening layer. The wafer is then subjected to ion implantation with two ion beams directed in directions substantially perpendicular to the longitudinal axes of the openings and inclined to the surface of the wafer at predetermined angles so as to strike the openings from two opposite sides. The thickness of the screening layer, the widths of the openings, and the angles of inclination of the ion beams being selected in a manner such that the beams strike the base of the first opening for substantially uniform doping of the underlying area of the wafer, but do not strike the base of the second opening. The novel method and apparatus enables selective doping by ion implantation to be performed without the use of a mask which is otherwise necessary for screening the second opening.

5 Claims, 3 Drawing Sheets

METHOD AND APPARATUS FOR THE SELECTIVE DOPING OF SEMICONDUCTOR MATERIAL BY ION IMPLANTATION

TECHNICAL FIELD

The present invention relates to a method for the selective doping of a wafer of semiconductor material by ion implantation, which can advantageously be used in the manufacture of integrated circuits having components with good dynamic performance.

BACKGROUND OF THE INVENTION

Electronic devices with good dynamic performance, that is, devices with a high frequency or a high switching speed, usually have extremely small dimensions and very thin junctions. The double polysilicon self-aligned technique (or DPSA), which can produce vertical npn bipolar transistors with transition frequencies greater than 50 GHz by virtue of regions with very small vertical doping profiles and by virtue of the use of lithographic processes which can produce sub-micrometric geometrical arrangements, is known. An application of this technique which is described in the Applicant's European patent application EP 0709896 also enables lateral pnp bipolar transistors to be produced with a single additional step; although these lateral pnp bipolar transistors do not have dynamic performance comparable with that of the vertical npn transistors, they are suitable or use to form, for example, biasing circuits, current mirrors, and load devices for gain stages in the same integrated circuit, in combination with vertical npn transistors.

An additional step is required which includes a photolithographic process for forming a mask which screens the base channels of the lateral pnp transistors during the ion implantation which is necessary to form the intrinsic base regions of the vertical npn transistors.

In view of the fact that any step of a method for manufacturing an integrated circuit involves manipulations and contaminations of various kinds which reduce the final output of the method, the object of the present invention is to propose a method of doping by implantation in which it is possible avoid the use of a mask as an implantation screen.

SUMMARY OF THE INVENTION

According to principles of the present invention, a method and apparatus are provided for selective doping of a wafer of semiconductor material. A screening layer is formed at a desired location on the wafer during the process steps. An opening is formed in the screening layer of a selected width. An ion implantation is performed into the opening at a selected angle relative to the perpendicular. The angle is selected so as to strike the opening from a first side. A second ion beam is formed which strikes the opening from a second, opposite side. The thickness of the layer, and the width of the opening, together with the angles of inclination are selected such that the beams strike the base to provide a substantial uniform doping of the wafer within a selected region. According to other principles of the present invention, a second opening is formed in the screening layer which is more narrow than the first opening. The second opening is sufficiently thin that the same ion beams, when directed at the wafer through the second opening, do not strike the bottom of the opening so that no ion implantation occurs into the semiconductor substrate under the second opening.

BRIEF DESCRIPTION OF THE DRAWINGS

An embodiment of the invention is described in detail below, by way of non-limiting example, with reference-to the appended drawings in which.

DETAILED DESCRIPTION OF THE INVENTION

Figure 1:
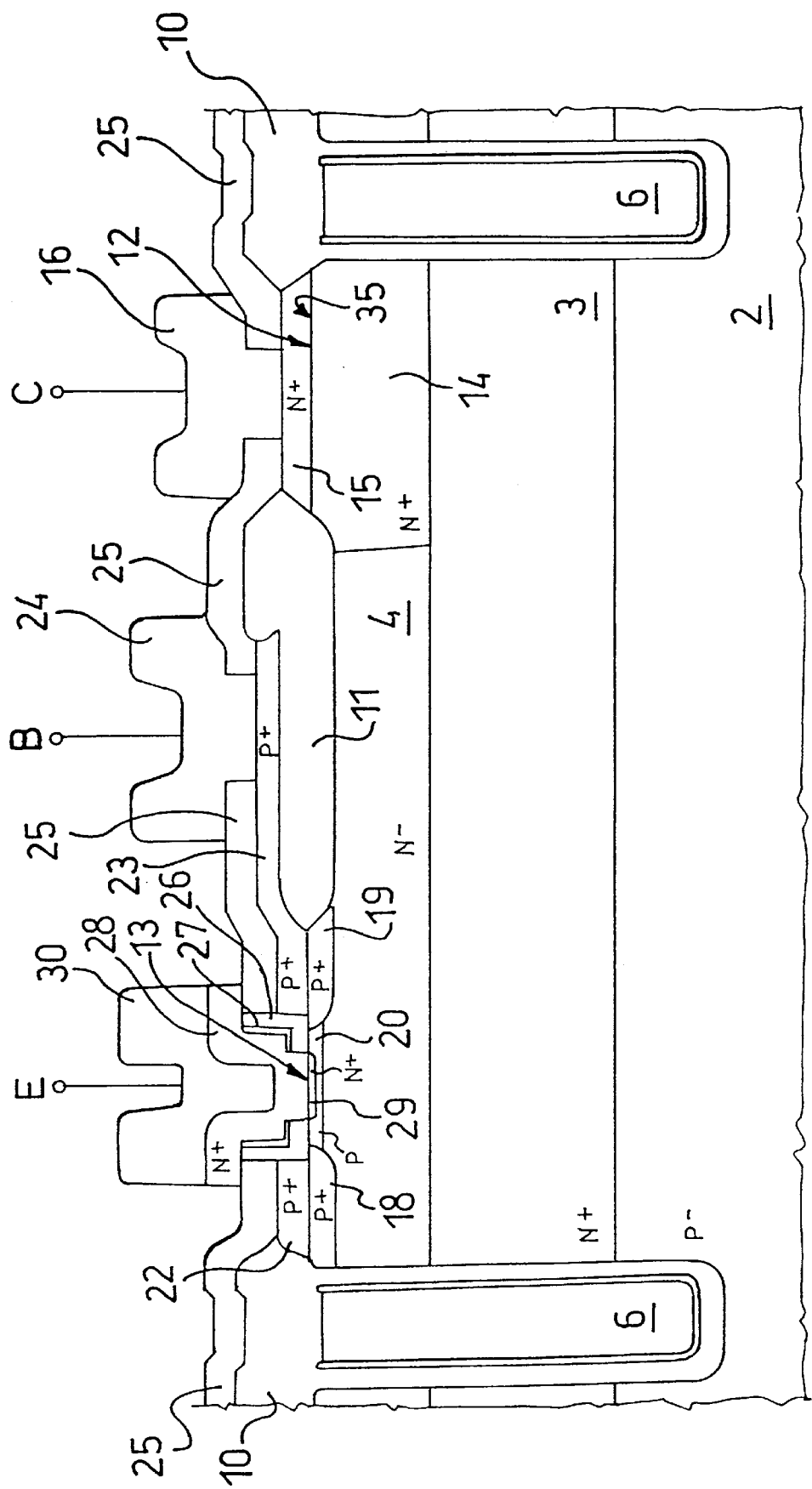
FIGS. 1 and 2 show in section, respectively, a vertical npn transistor and a lateral pnp transistor formed by the DPSA technique on the same wafer of semiconductor material.

FIG. 1 shows, in section, a portion of a wafer of semiconductor material, for example, monocrystalline silicon, comprising a p- substrate 2, a buried n+layer 3, and an epitaxial n–layer 4. An insulation structure 6 extends from the front surface 35 of the wafer as far as the substrate 2, forming a frame which encloses the structure of the vertical npn transistor, insulating it from the rest of the wafer.

Silicon dioxide (field oxide) 10 and 11 extend on the surface 35 and are partially embedded in the epitaxial layer 4. The field oxide 10 completes the insulation of the vertical npn transistor structure on the surface and the field oxide 11 delimits and insulates from one another two areas indicated 12 and 13.

A diffused n+region 14 (a sinker) extends from the area 12 through the epitaxial layer 4 as far as the buried layer 3 and has the function of a deep collector contact. A layer 15 of n+polycrystalline silicon is formed on the area 12 in contact with the sinker region 14 and a metal strip 16 is in contact with the layer 15 in order to form the collector electrode C of the transistor.

Two diffused p+regions 18 and 19 extend into the epitaxial layer 14 from the area 13 and together form the so-called extrinsic base of the transistor. They are joined by a diffused p region 20 which forms the so-called intrinsic base of the transistor. Two regions 22 and 23 of p+doped polycrystalline silicon extend on the two regions 18 and 19, respectively. The regions 18 and 19 are formed by causing p-type impurities contained in the polycrystalline silicon of the regions 22 and 23 to diffuse into the epitaxial layer 4. The region 23 also extends partly over the field oxide field oxide 11 and a metallic element 24 which forms the base electrode B of the transistor is disposed over the region 23. A layer 25 of dielectric material, for example, silicon dioxide, covers the polycrystalline silicon regions 15, 22 and 23, except for the areas of contact of the metal collector and base electrodes 16 and 24.

The opposing side edges of the regions 22 and 23 and of the overlying portions of the silicon dioxide layer 25 and the regions of the surface 35 adjacent these edges are covered by structures 26 and 27 with L-shaped cross-sections, made of silicon dioxide and silicon nitride, respectively. An insert 28 of n+doped polycrystalline silicon fills the space delimited by the L-shaped structures 26 and 27 and is in contact, on the surface 35, with an extremely thin, diffused n+region 29. This region is formed by causing n-type impurities contained in the polycrystalline silicon of the insert 28 to diffuse into the intrinsic base region 20. A metal strip 30 extends over the insert 28, forming the emitter electrode E of the transistor.

Figure 2:
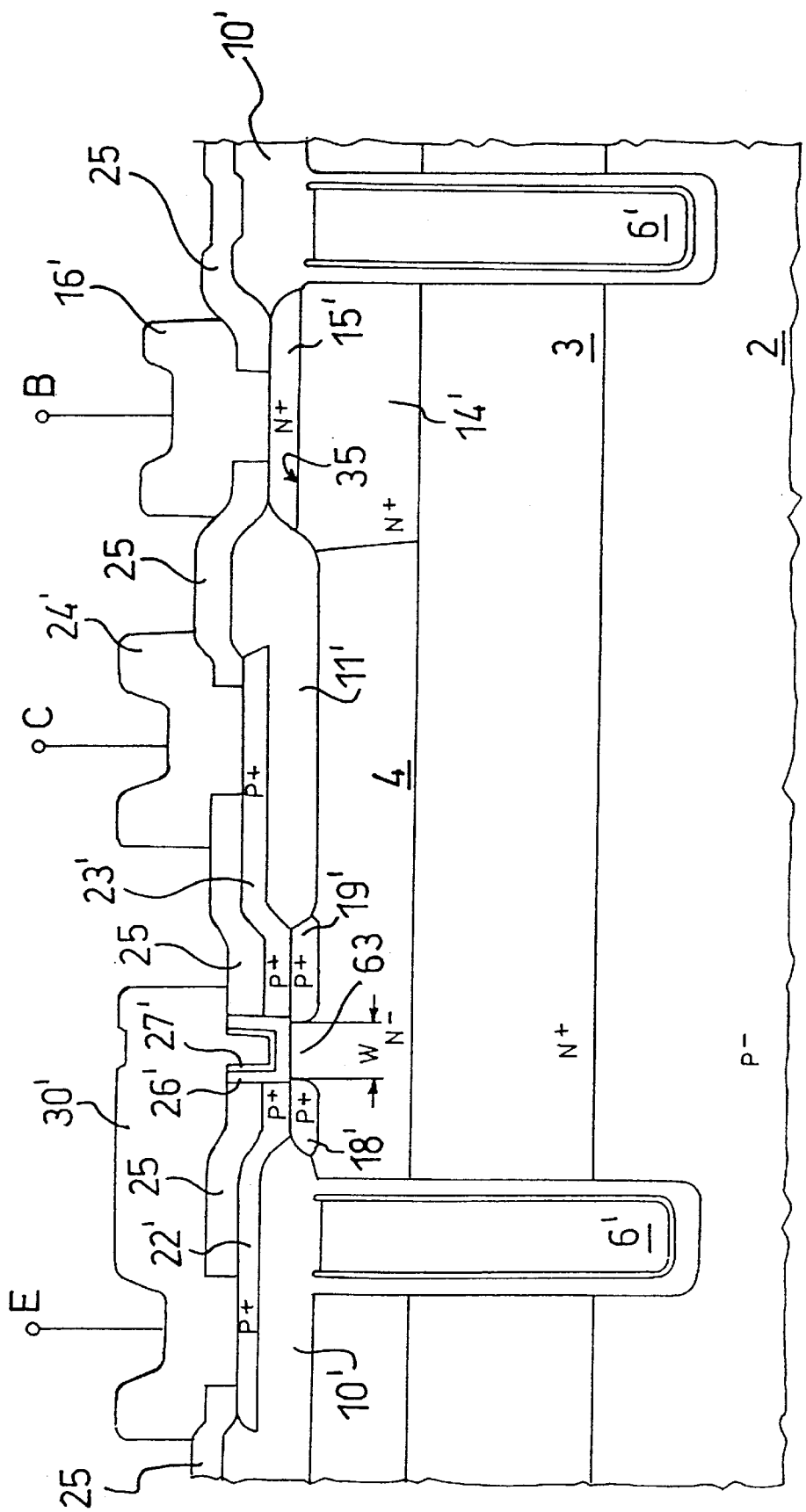

The method used to produce the vertical npn transistor described above can also be used to produce lateral pnp transistors. A transistor of this type is shown in FIG. 2 in which elements the same as those of FIG. 1 are indicated by the same reference numerals and elements produced by the same steps of the method are indicated by the same reference numerals, to which an apostrophe has been added.

The structure of FIG. 2 differs from that of FIG. 1 in the following details:

it lacks a p region such as the region 20 and, naturally, also an n+region such as the region 29 (the emitter of the npn transistor), so that the regions 18' and 19', which constitute the emitter and collector regions of the pnp transistor, respectively, are insulated from one another and separated by a channel 63 which comprises the active base region, the metal strip 16' constitutes the base electrode B rather than the collector electrode, the silicon dioxide and silicon nitride structures 26' and 27' with L-shaped cross-sections are welded together to form a structure with a U-shaped crosssection, the polycrystalline silicon insert (28 in FIG. 1) is missing, the metal strip 30', which is the emitter electrode E of the pnp transistor, is in contact, through an opening in the silicon dioxide layer 25, with the polycrystalline silicon region 22' which in turn is in contact with the emitter region 18', the electrode 24' constitutes the collector electrode C rather than the base electrode.

In addition to the structural differences listed above, there are also dimensional differences, since the distance between the regions 18' and 19', that is, the width w of the base channel 63, is less than the distance between the corresponding regions 18 and 19 in order to produce a pnp transistor with acceptable dynamic performance. With the structure described above, it is possible to achieve base widths down to 0.8 mm.

Some steps of the method of manufacturing the structure of FIGS. 1 and 2 which are useful for an understanding of the limitations of the prior art and the characteristic aspects of the new method will now be described.

Figure 3:
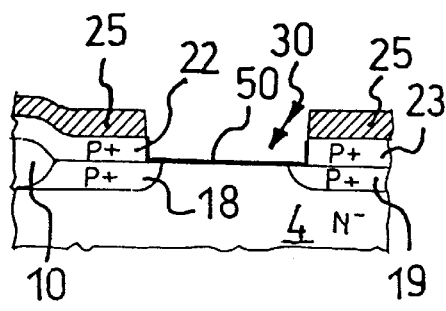
FIGS. 3 and 4 show, in section, two portions of the wafer which are intended to contain the transistors of FIGS. 1 and 2, during an intermediate stage of the manufacturing process.
Figure 4:
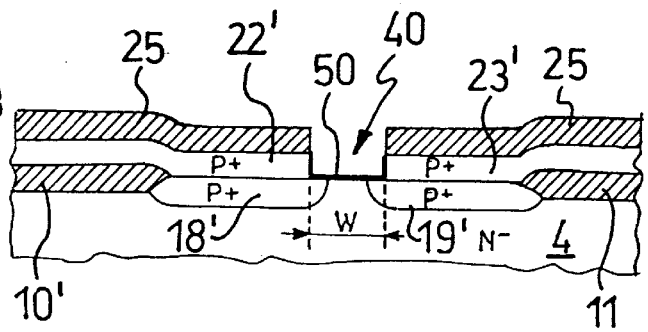

FIGS. 3 and 4 show two portions of the structures of FIGS. 1 and 2, respectively, at an intermediate production stage and, in particular, that which precedes the ion implantation to form the intrinsic base region of the vertical npn transistor. The structures of FIGS. 3 and 4 have been produced by the formation of the field oxide 10, 11, 10' and 11' on the epitaxial layer 4 by the known technique of localized growth of silicon dioxide by high-temperature oxidation, the deposition of a layer (about 200 nm thick) of polycrystalline silicon doped with p-type impurities, the deposition of a layer (about 350 nm thick) of silicon dioxide, photolithography and anisotropic etching of the two superimposed layers of silicon dioxide and polycrystalline silicon in order to open the emitter window 30 of the npn transistor and the base channel 40 of the pnp transistor and, finally, heating of the resulting structure to high temperature in an oxidizing atmosphere in order to cause some of the p-type doping impurities contained in the remaining regions 22, 23 and 22', 23' of the polycrystalline silicon layer to diffuse into the epitaxial layer 4, thus forming the extrinsic base region 18, 19 of the npn transistor and the emitter and collector regions 18', 19' of the pnp transistor, and to cause a thin layer 50 (about 10 nm thick) of silicon dioxide (thermal oxide) to grow on the bases of the openings 30 and 40.

The superimposed layers of polycrystalline silicon (22, 23, 22', 23') and of silicon dioxide (25) constitute a screen for the subsequent implantation of ions, for example, boron ions, which are necessary to form the intrinsic base (20 in FIG. 1) of the npn transistor. The thin layer of thermal oxide 50 is substantially permeable to the implantation and serves, as is known, to prevent surface damage due to the implantation and, in this case, to mask the surface 35 of the epitaxial silicon layer from subsequent chemical etching. To prevent implantation also through the base channels 40 of the pnp transistors, according to the prior art, it is necessary to screen them, for example, by forming a photoresist mask, not shown, which covers the base channels 40, leaving the emitter windows 50 of the npn transistors uncovered. This mask is removed after implantation.

According to the invention, the steps necessary to screen the base channels 40 of the pnp transistors are completely eliminated by virtue of the fact that, instead of performing the implantation with an ion beam perpendicular to the surface of the wafer, as in conventional methods, the implantation is performed with two ion beams directed towards opposite sides of the openings 30 and 40, perpendicular to the longitudinal axes of the openings and inclined sufficiently to strike the bases of the emitter windows 30 of the npn transistors to an adequate extent for substantially uniform doping, but not to strike the bases of the base channels 40 of the pnp transistors. A condition for the advantageous implementation of the method according to the invention is that the openings 30 and 40 be substantially rectilinear, elongate openings. Naturally, another condition is that the emitter windows 30 be wider than the base channels 40. Yet another condition is defined by the geometrical relationships between the dimensions of the base channels and the angles of inclination of the ion beams.

Figure 5:
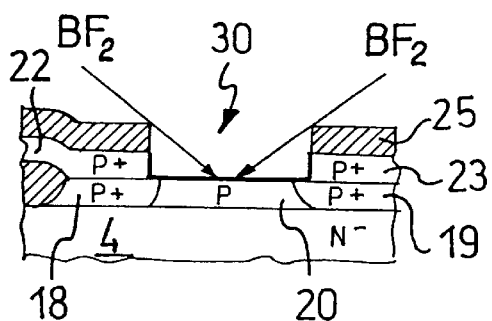
FIGS. 5 and 6 show two details of the structures of FIGS. 3 and 4, subjected to implantation in accordance with the method of the present invention.
Figure 6:
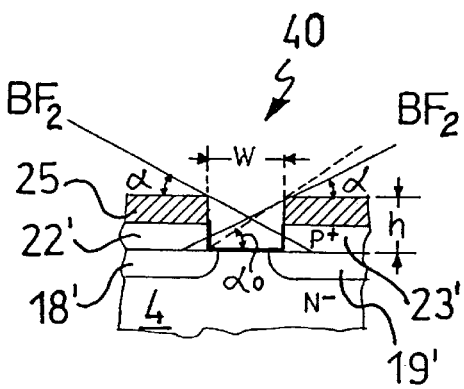

FIGS. 5 and 6 will be examined in order to consider this latter condition in greater detail. The depth of the base channels is indicated h, their width is indicated w, and the angle of inclination of the ion beams $BF_2$ to the surface of the wafer is indicated $\alpha$. In this example, the angles of inclination $\alpha$ of the two ion beams are equal. By simple geometrical considerations, it can be seen that the angle of inclination a of the beams should not be greater than the limit angle $\alpha o = \arctan(h/w)$.

The method then continues with the steps required to form the emitter regions of the npn transistor. More particularly, a thin layer of dielectric material, for example, silicon nitride, having a thickness th1=70 nm, and then a layer of polycrystalline silicon, for example, having a thickness th2=300 nm, are deposited on the structures shown in FIGS. 3 and 4.

Figure 7:
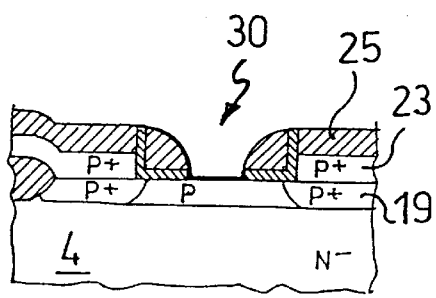
FIGS. 7 and 8 show, in section, two portions of the wafer during a stage of the method subsequent to that shown in FIGS. 5 and 6.
Figure 8:
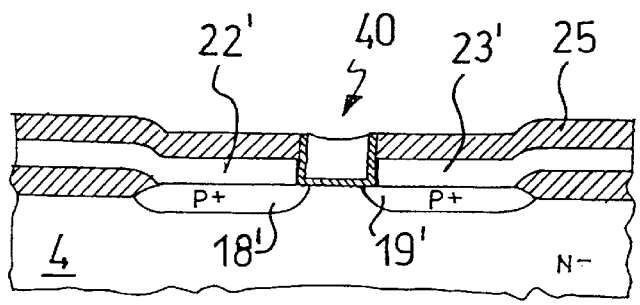

If the width w of the base channels is less than 2(th1+th2), that is, in this example, less than 740 nm, the base channels are completely closed by the two superimposed layers. The polycrystalline silicon layer is removed by anisotropic etching, but residues thereof remain both in the base channels, closing them completely, and along the longitudinal edges of the emitter windows of the npn transistors, reducing their openings. Subsequent chemical etching removes the layer of silicon nitride which remains uncovered including, amongst other portions, that which remains in the bases of the emitter windows. At this point, the situation is that shown in FIGS. 7 and 8.

Of course, the isolation layer can be any acceptable structure and need not be an oxide, a field oxide, or the like. The screening layer can be a layer that is later removed by etching or other technique. The screening layer can be a nitride, an oxide, a polysilicon layer, a silicide, or combinations thereof.

The residues of polycrystalline silicon are then removed by chemical etching. It will be noted that the monocrystalline silicon of the epitaxial layer 4 cannot be etched because it is covered by the thin layer 50 of thermal oxide.

This latter layer is also removed by chemical etching. Strips of polycrystalline silicon (28 in FIG. 1) are then formed on the emitter windows by the deposition of an n+doped polycrystalline silicon layer and subsequent selective removal. A subsequent high-temperature treatment causes some of the doping impurities contained in the polycrystalline silicon of the strips 28 to form n+emitter regions (29 in FIG. 1) by diffusion into the respective intrinsic base regions (20 in FIG. 1).

The usual steps then follow for the formation of the metal electrodes (16, 24, 30 in FIG. 1 and 16', 24', 30' in FIG. 2) and for the passivation of the device. It will be noted that the emitter electrode 30' of the pnp transistor is formed so as to extend above the base channel, that is, above the region in which the emitter and collector junctions are formed, and thus also has the function of a field screen (a field plate) which improves the voltage holding of the junctions and limits the modulation of the base width with variations of the voltage between the collector and the emitter (Early effect).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for the selective doping of a wafer of semiconductor material by ion implantation, comprising:
   a) forming an implantation screening layer of predetermined thickness on the wafer;
   b) forming, in the screening layer, at least a first rectilinear, elongate opening having a first width, and at least a second rectilinear, elongate opening, substantially parallel to the first opening and having a second width smaller than the first width;
   c) subjecting the wafer to ion implantation with two ion beams directed in directions substantially perpendicular to the longitudinal axes of the openings and inclined to the surface of the wafer at predetermined angles so as to strike the openings from two opposite sides; and
   the thickness of the screening layer, the widths of the openings, and the angles of inclination of the ion beams being selected in a manner such that the beams strike the base of the first opening for substantially uniform doping of the underlying area of the wafer, but do not strike the base of the second opening, wherein step a) comprises the formation of a first layer of material containing doping impurities of a first type and the formation, on the first layer, of a second layer of dielectric material, step b) comprises selective etching of the second and of the first screening layers to form the above mentioned first and second openings, wherein the semiconductor material is monocrystalline silicon, and, wherein before step c), the wafer is subjected to high-temperature treatment in an oxidizing atmosphere so as to cause some of the doping impurities contained in the first screen layer to diffuse into the wafer to simultaneously form extrinsic base regions of a vertical npn bipolar transistor and emitter and collector regions of a lateral pnp bipolar transistor and also to form on the openings, a layer of silicon oxide which is at least partially permeable to the ion implantation.

2. A method according to claim 1, in which the angles of inclination of the two ion beams are equal.

3. A method according to claim 1, in which the first opening delimits the area for the intrinsic base of the vertical npn bipolar transistor and the second opening delimits the area of the base channel of the lateral pnp bipolar transistor.

4. A method of forming bipolar transistors with good dynamic performance, at least one transistor being of the vertical npn type and at least one transistor being of the lateral pnp type, in a first region and in a second region of a layer, doped with n-type impurities, of a wafer of semiconductor material, comprising:
   a) forming a first layer of polycrystalline silicon doped with p-type impurities in the first region and in the second region;
   b) forming a second layer of dielectric material on the first layer of polycrystalline silicon;
   c) selectively etching the superimposed first and second layers so as to form a first opening and a second opening which are rectilinear, elongate and parallel to one another and which terminate in a first area and in a second area of the first and second regions, respectively, which are intended to delimit, on the surface, a portion of the base region of the vertical npn transistor, and the base region of the lateral pnp transistor, respectively;
   d) subjecting the wafer to a high-temperature treatment in an oxidizing atmosphere so as to cause some of the p-type impurities contained in the doped polycrystalline silicon layer to diffuse into the first region and into the second region, so as to produce emitter and collector regions of the pnp lateral transistor at the sides of the second opening and portions of the base region of the vertical npn transistor at the sides of the first opening and to form a layer of silicon dioxide on the first area and on the second area;
   e) subjecting the wafer to ion implantation with p-type impurities with the use of two ion beams which are directed in directions substantially perpendicular to the longitudinal axes of the first opening and of the second opening and which are inclined to the surface of the wafer at two predetermined angles so as to strike the openings from two opposite sides, the thickness of the polycrystalline silicon layer, the widths of the openings, and the angles of inclination of the ion beams being selected in a manner such that the beams strike the base of the first opening for substantially uniform doping of the underlying area of the wafer, but do not strike the base of the second opening so as to dope the first region, between the above-mentioned portions of the base region, to form the intrinsic base region of the vertical npn transistor, without doping the base region of the lateral pnp transistor;
   f) forming an n-type emitter region in the intrinsic base region of the vertical npn transistor; and
   g) forming metal electrodes on the emitter, base and collector regions of the npn and pnp transistors.

5. A method according to claim 4, in which step f) comprises:
   the formation of a layer of dielectric material on the wafer;
   the formation of a layer of polycrystalline silicon on the layer of dielectric material;
   the thicknesses of the latter two layers and the dimensions of the second opening being such that the second opening is completely closed by the superimposed layers of dielectric material and of polycrystalline silicon;
   the removal of the layer of polycrystalline silicon by anisotropic etching so as to leave residues of polycrystalline silicon along the longitudinal edges of the first opening;

the removal of the layer of dielectric material from the base of the first opening;

the removal of the residues of polycrystalline silicon;

the formation of a strip of polycrystalline silicon doped with n-type impurities in the first opening; and a high-temperature treatment to cause some of the n-type impurities contained in the polycrystalline silicon strip to diffuse into the intrinsic base region.

* * * * *

UNITED STATES PATENT AND TRADEMARK OFFICE
CERTIFICATE OF CORRECTION

PATENT NO. : 6,284,615 B1
DATED : September 4, 2001
INVENTOR(S) : Angelo Pinto et al.

It is certified that error appears in the above-identified patent and that said Letters Patent is hereby corrected as shown below:

<u>Title page,</u>
Item [75], the first listed inventor's residence should read -- Augusta, Italy --.

<u>Column 5,</u>
Line 47, "of the second opening, wherein step a)" should read as -- of the second opening --, wherein step a) --

Signed and Sealed this

Eighteenth Day of June, 2002

Attest:

JAMES E. ROGAN
Attesting Officer *Director of the United States Patent and Trademark Office*